(12) United States Patent
Zhu et al.

(10) Patent No.: US 12,310,225 B2
(45) Date of Patent: May 20, 2025

(54) STRETCHABLE DISPLAY PANEL AND METHOD FOR MANUFACTURING SAME, AND DISPLAY DEVICE

(71) Applicant: BOE Technology Group Co., Ltd., Beijing (CN)

(72) Inventors: Xiaoyan Zhu, Beijing (CN); Jinxiang Xue, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 489 days.

(21) Appl. No.: 17/764,440

(22) PCT Filed: Jun. 8, 2021

(86) PCT No.: PCT/CN2021/098911
§ 371 (c)(1),
(2) Date: Mar. 28, 2022

(87) PCT Pub. No.: WO2022/017026
PCT Pub. Date: Jan. 27, 2022

(65) Prior Publication Data
US 2022/0407023 A1 Dec. 22, 2022

(30) Foreign Application Priority Data
Jul. 24, 2020 (CN) .......................... 202010724151.7

(51) Int. Cl.
*H10K 77/10* (2023.01)
*H10K 50/844* (2023.01)
*H10K 71/00* (2023.01)

(52) U.S. Cl.
CPC ......... *H10K 77/111* (2023.02); *H10K 50/844* (2023.02); *H10K 71/00* (2023.02)

(58) Field of Classification Search
CPC ...... H10K 77/10; H10K 77/111; H10K 50/84; H10K 50/844; H10K 71/00; H10K 71/10;
(Continued)

(56) References Cited

U.S. PATENT DOCUMENTS

| | | | | |
|---|---|---|---|---|
| 2009/0266471 A1* | 10/2009 | Kim | .................. | G02F 1/133305 156/247 |
| 2015/0287771 A1* | 10/2015 | Lee | ...................... | H10K 50/844 438/34 |

(Continued)

FOREIGN PATENT DOCUMENTS

| CN | 107706305 A | 2/2018 |
|---|---|---|
| CN | 109786428 A | 5/2019 |

(Continued)

OTHER PUBLICATIONS

CN202010724151.7 first office action.

*Primary Examiner* — Natalia A Gondarenko
(74) *Attorney, Agent, or Firm* — IPro, PLLC (57) ABSTRACT

Provided is a method for manufacturing a stretchable display panel. The method includes: forming an organic protection structure and an inorganic protection structure which are laminated on a rigid substrate; forming a flexible substrate on the inorganic protection structure; forming a plurality of pixel islands and inter-island connections for connecting adjacent pixel islands on the flexible substrate; forming an encapsulation layer on the pixel islands and the inter-island connections; and stripping off the rigid substrate.

13 Claims, 7 Drawing Sheets

(58) Field of Classification Search
CPC ...... H10K 71/20; H10K 71/211; H10K 71/30;
H10K 71/40; H10K 71/50; H10K 71/60;
H10K 71/611; H10K 71/621; H10K
71/80; H10K 59/873; H10K 59/1201;
H10K 59/121; H10K 59/124; H10K
59/18; H10K 50/10; H10K 50/81; H10K
50/813; H10K 50/814; H10K 50/816;
H10K 50/82; H10K 50/822; H10K
50/828; H10K 50/8428; H10K 50/8445;
H10K 59/10; H10K 59/805; H10K
59/8051; H10K 59/80515; H10K
59/80517; H10K 59/8052; H10K
59/80521; H10K 59/80524; H10K
59/80523; H10K 59/87; H10K 59/871;
H10K 59/8723; H10K 59/8731; Y02E
10/549; G09F 9/301; G09F 9/302; G09F
9/3023; Y02P 70/50; H01L 33/20; H01L
33/08; H01L 33/54; H01L 33/38; H01L
33/62
USPC .............................................. 257/40, 79, 72
See application file for complete search history.

(56) References Cited

U.S. PATENT DOCUMENTS

| | | | |
|---|---|---|---|
| 2016/0028043 A1* | 1/2016 | Kwon | ................. H10K 50/844 |
| | | | 257/40 |
| 2016/0190389 A1* | 6/2016 | Lee | ................... G02F 1/136277 |
| | | | 438/28 |
| 2018/0040858 A1 | 2/2018 | Chien et al. | |
| 2019/0074465 A1 | 3/2019 | Jung et al. | |
| 2019/0097162 A1* | 3/2019 | Wang | .................... H10K 71/70 |
| 2020/0044192 A1 | 2/2020 | Okabe et al. | |
| 2020/0168590 A1 | 5/2020 | Kim et al. | |
| 2021/0376266 A1 | 12/2021 | Li et al. | |

FOREIGN PATENT DOCUMENTS

| | | |
|---|---|---|
| CN | 111341210 A | 6/2020 |
| CN | 111864067 A | 10/2020 |
| WO | 2019026155 A1 | 2/2019 |

* cited by examiner

STRETCHABLE DISPLAY PANEL AND METHOD FOR MANUFACTURING SAME, AND DISPLAY DEVICE

CROSS-REFERENCE TO RELATED APPLICATION

This application is a U.S. national stage of international application No. PCT/CN2021/098911, filed on Jun. 8, 2021, which claims priority to Chinese Patent Application No. 202010724151.7, filed on Jul. 24, 2020 and entitled "STRETCHABLE DISPLAY PANEL AND METHOD FOR MANUFACTURING SAME, AND DISPLAY DEVICE", the content of which is herein incorporated by reference in its entirety.

TECHNICAL FIELD

The present disclosure relates to the field of display technologies, and in particular, relates to a stretchable display panel a method for manufacturing the same, and a display device.

BACKGROUND

At present, stretchable display panels have received extensive attention. A stretchable display panel generally includes a plurality of pixel islands, and inter-island connectors for connecting adjacent pixel islands. Each pixel island may include a plurality of light-emitting devices. Due to hollow structures between the pixel islands and the inter-island connectors, the stretchable display panel can be stretched. In order to prolong the service life of the light-emitting devices in the pixel islands, an encapsulation layer needs to be disposed on the pixel islands and the inter-island connectors.

In the process of manufacturing the stretchable display panel, generally, the pixel islands and the inter-island connectors need to be formed on a rigid substrate at first; then the encapsulation layer is formed on the pixel islands and the inter-island connectors; and finally, the stretchable display panel can be acquired by stripping off the rigid substrate.

SUMMARY

Embodiments of the present disclosure provide a stretchable display panel and a method for manufacturing the same, and a display device. The technical solutions are as follows.

In an aspect, a method for manufacturing a stretchable display panel is provided. The method includes:

forming an organic protective structure and an inorganic protective structure which are laminated on a rigid substrate:

forming a flexible substrate on the inorganic protective structure:

forming a plurality of pixel islands and inter-island connectors for connecting adjacent pixel islands on the flexible substrate, wherein the pixel islands and the inter-island connectors define hollow structures, and an orthographic projection of the hollow structure on the rigid substrate is within an orthographic projection of the organic protective structure on the rigid substrate and within an orthographic projection of the inorganic protective structure on the rigid substrate;

forming an encapsulation layer on the pixel islands and the inter-island connectors; and stripping off the rigid substrate.

Optionally, the hollow structure includes: a first opening, and a second opening communicated with the first opening, wherein the first opening is closer to the rigid substrate than the second opening is, and an orthographic projection of the first opening on the rigid substrate is within an orthographic projection of the second opening on the rigid substrate.

Optionally, the first opening is sleeved in the second opening.

Optionally, a slope angle of a sidewall of the first opening is greater than a slope angle of a sidewall of the second opening.

Optionally, forming the organic protective structure and the inorganic protective structure which are laminated on the rigid substrate includes:

forming an organic protective film and an inorganic protective film in sequence on the rigid substrate; and performing a single patterning process on the inorganic protective film to form the organic protective structure and the inorganic protective structure on the rigid substrate.

Optionally, performing the single patterning process on the inorganic protective film to form the organic protective structure and the inorganic protective structure on the rigid substrate includes:

forming a photoresist film on the inorganic protective film; performing exposure and development on the photoresist film to form a photoresist pattern; performing first etching on the inorganic protective film to form the inorganic protective structure with the photoresist pattern; performing second etching on the organic protective film to form the organic protective structure with the photoresist pattern and the inorganic protective structure; and removing the photoresist pattern to form the organic protective structure and the inorganic protective structure.

Optionally, stripping off the rigid substrate includes:

stripping off the rigid substrate after carbonizing the organic protective structure and the flexible substrate.

Optionally, when the rigid substrate is stripped off, the organic protective structure, or the organic protective structure and the inorganic protective structure are also stripped off.

Optionally, forming the plurality of pixel islands and the inter-island connectors for connecting adjacent pixel islands on the flexible substrate includes:

forming a plurality of functional layers on the flexible substrate; and forming openings in the plurality of functional layers to form the pixel islands and the inter-island connectors, wherein the hollow structures penetrate the plurality of functional layers and the flexible substrate.

Optionally, the flexible substrate includes a pixel region, and the pixel island is disposed in the pixel region; and forming the plurality of functional layers on the flexible substrate includes:

forming a plurality of display functional layers in the pixel region of the flexible substrate, the plurality of display functional layers being configured to form light-emitting devices in the pixel islands and drive circuits connected to the light-emitting devices; and forming a plurality of connection functional layers in a region, other than the pixel region, of the flexible substrate, the plurality of connection functional layers being configured to form connection traces and trace protective structures in the inter-island connectors.

Optionally, the flexible substrate further includes a connection region, and the inter-island connector is disposed in the connection region; and forming the openings in the plurality of functional layers to form the pixel islands and the inter-island connectors includes:

removing portions, other than the connection region, of the plurality of connection functional layers, and removing portions, other than the connection region and the pixel region, of the flexible substrate, to form the pixel islands and the island inter-connectors.

Optionally, after stripping off the rigid substrate, the method further includes:

forming a protective film on a side, away from the encapsulation layer, of the flexible substrate.

Optionally, the inorganic protective structure is made of a metal material.

In another aspect, a stretchable display panel is provided. The stretchable display panel is manufactured by the method for manufacturing a stretchable display panel according to any one of the above aspect. The stretchable display panel includes:

a flexible substrate, and a plurality of pixel islands and inter-island connectors for connecting adjacent pixel islands, the pixel islands and the inter-island connectors being disposed on the flexible substrate, wherein the pixel islands and the inter-island connectors define hollow structures, and the stretchable display panel further includes: an encapsulation layer on the pixel islands and the inter-island connectors.

In still another aspect, a display device is provided. The display device includes any one of the above stretchable display panels.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and persons of ordinary skill in the art may still derive other drawings from these accompanying drawings without creative efforts.

DETAILED DESCRIPTION

For clearer descriptions of the objectives, technical solutions, and advantages of the present disclosure, the embodiments of the present disclosure are described in detail hereinafter with reference to the accompanying drawings.

Figure 1:
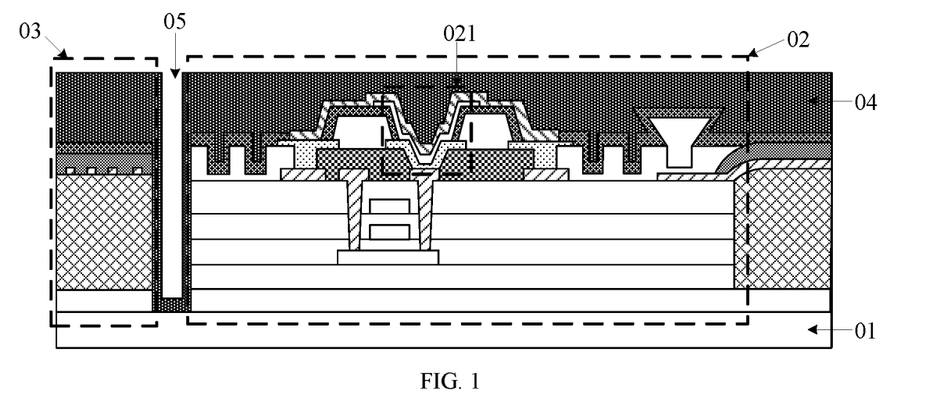
FIG. 1 is a schematic diagram of formation of pixel islands and inter-island connectors on a rigid substrate, and an encapsulation layer according to the related art.

In the related art, as shown in FIG. 1, FIG. 1 is a schematic diagram of formation of pixel islands and inter-island connectors on a rigid substrate, and forming an encapsulation layer according to the related art. After a plurality of pixel islands 02 and inter-island connectors 03 for connecting adjacent pixel islands 02 are formed on a rigid substrate 01, an encapsulation layer 04 may be deposited on the rigid substrate 01 on which the pixel islands 02 and the inter-island connectors 03 are formed. The pixel island 02 may include a plurality of light-emitting devices 021. It should be noted that FIG. 1 only shows the schematic structural diagram of one light-emitting device 021 in the pixel island 02.

Since a hollow structure 05 is disposed between the pixel island 02 and the inter-island connector 03, after the encapsulation layer 04 is formed on the pixel islands 02 and the inter-island connectors 03, the encapsulation layer 04 is in contact with the rigid substrate 01. A film layer, in contact with the rigid substrate 01, in the encapsulation layer 04 is usually an inorganic layer. When the inorganic layer in the encapsulation layer 04 is in contact with the rigid substrate 01, it is difficult to separate the rigid substrate 01 from the inorganic layer, and cracks are extremely easy to occur in the inorganic layer in the encapsulation layer 04 in the process of stripping off the rigid substrate 01. The cracks extend upward along sidewalls of the hollow structure 05, and moisture, oxygen and the like in air enter the encapsulation layer 04 through the cracks very easily, resulting in encapsulation failure of the encapsulation layer 04, which finally shortens the service life of the light-emitting devices 021 in the pixel islands 02.

Figure 2:
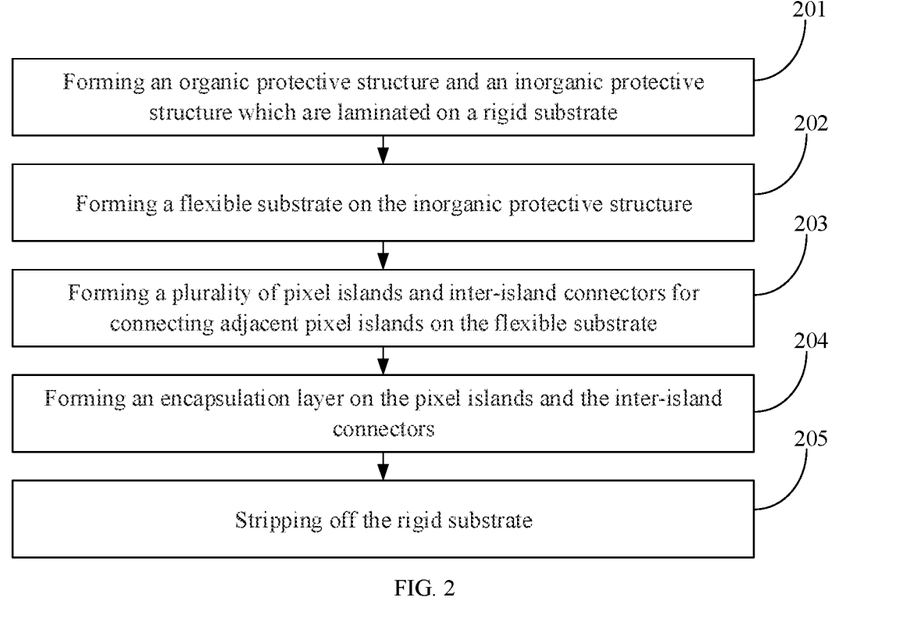
FIG. 2 is a flowchart of a method for manufacturing a stretchable display panel according to an embodiment of the present disclosure.

Please refer to FIG. 2, which is a flowchart of a method for manufacturing a stretchable display panel according to an embodiment of the present disclosure. The method for manufacturing a stretchable display panel may include the following steps.

In step 201, an organic protective structure and an inorganic protective structure which are laminated are formed on a rigid substrate.

In step 202, a flexible substrate is formed on the inorganic protective structure.

In step 203, a plurality of pixel islands and inter-island connectors for connecting adjacent pixel islands are formed on the flexible substrate.

The pixel islands and the inter-island connectors define hollow structures. The orthographic projection of the hollow structure on the rigid substrate is within the orthographic projection of the organic protective structure on the rigid substrate and within the orthographic projection of the inorganic protective structure on the rigid substrate. A plurality of light-emitting devices may be provided in the pixel island.

In the embodiment of the present disclosure, materials of the flexible substrate and the organic protective structure formed on the rigid substrate are both organic materials. The hollow structures need to be formed at the same time in the process of forming the pixel islands and the inter-island connectors, and portion of the flexible substrate needs to be etched off in the process of forming the hollow structures. Therefore, in order to prevent the organic protective structure from being etched off when the flexible substrate is etched, the inorganic protective structure may be disposed on the side, away from the rigid substrate, of the organic protective structure. The inorganic protective structure can protect the organic protective structure and prevent the organic protective structure from being etched off.

In step 204, an encapsulation layer is formed on the pixel islands and the inter-island connectors.

In step 205, the rigid substrate is stripped off.

In summary, in the method for manufacturing a stretchable display panel according to the embodiment of the present disclosure, the organic protective structure and the inorganic protective structure are firstly formed on the rigid substrate, and the orthographic projection of the organic protective structure on the rigid substrate and the orthographic projection of the inorganic protective structure on the rigid substrate cover the orthographic projection of the hollow structure on the rigid substrate. In this way, after the encapsulation layer is formed, the encapsulation layer is not in contact with the rigid substrate, but the organic protective structure is always in contact with the rigid substrate. It's extremely easy to strip off the organic protective structure from the rigid substrate, and the probability of cracks occurring in the stripping process is relatively low, so that the probability of encapsulation failure of the encapsulation layer is effectively reduced, thereby prolonging the service life of the light-emitting devices in the pixel islands.

Figure 3:
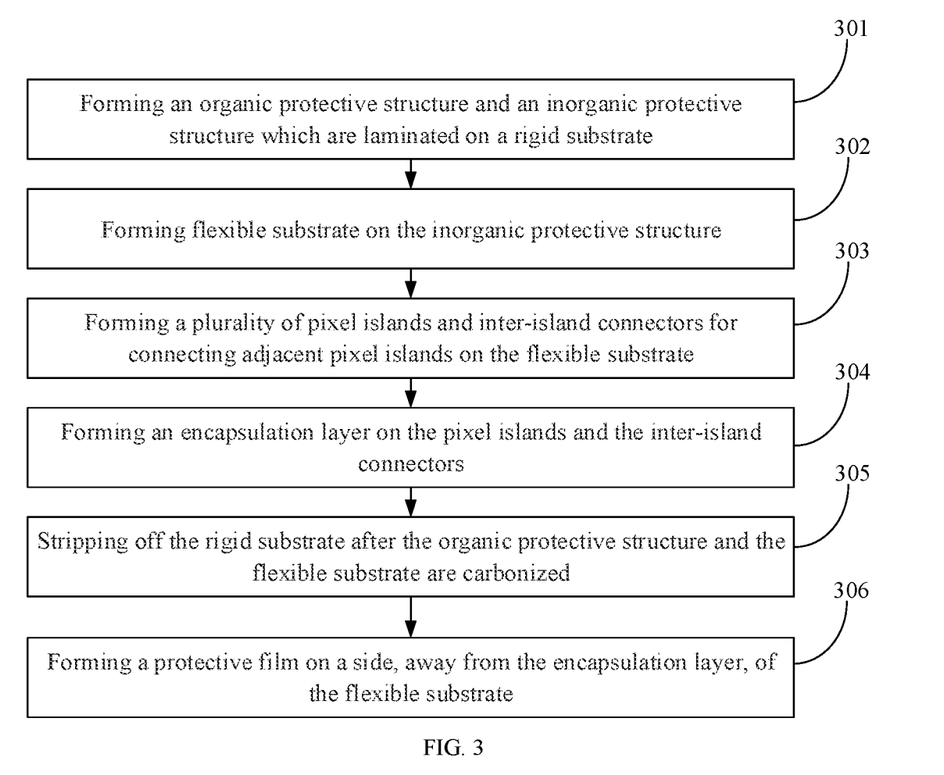
FIG. 3 is a flowchart of another method for manufacturing a stretchable display panel according to an embodiment of the present disclosure.

Please refer to FIG. 3, which is a flowchart of another method for manufacturing a stretchable display panel according to an embodiment of the present disclosure. The method for manufacturing a stretchable display panel may include the following steps.

In step 301, an organic protective structure and an inorganic protective structure which are laminated are formed on a rigid substrate.

Optionally, the rigid substrate may be a glass substrate. The organic protective structure may be made from an organic material, for example, an organic material of a polyimide system. The inorganic protective structure may be made from an inorganic material, for example, may be a non-metal material such as silicon nitride or silicon oxide, or a metal material such as metal copper, metal titanium, metal aluminum or an alloy. When the inorganic protective structure is made from a metal material, the inorganic protective structure may be of a three-layer metal structure of metal titanium, metal aluminum and metal titanium which are laminated, and the metal material may serve as a mask for etching the organic material thereunder. In this case, the inorganic protective structure and the organic protective structure may be formed through a single patterning process.

For example, forming the organic protective structure and the inorganic protective structure which are laminated on the rigid substrate may include the following steps.

In step 3011, an organic protective film and an inorganic protective film are sequentially formed on the rigid substrate.

In the embodiment of the present disclosure, the organic protective film and the inorganic protective film may be sequentially formed on the rigid substrate by any one of deposition, coating, sputtering and the like.

In step 3012, the single patterning process is performed on the inorganic protective film to form the organic protective structure and the inorganic protective structure on the rigid substrate.

Figure 4:
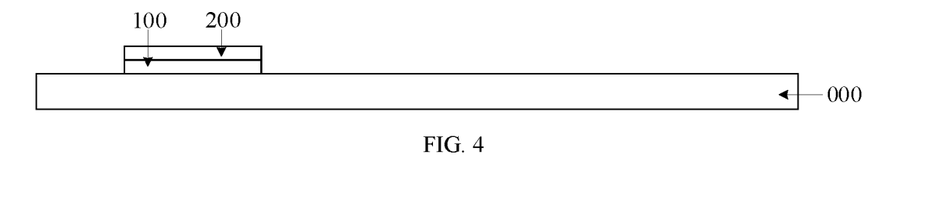
FIG. 4 is a schematic diagram of formation of an organic protective structure and an inorganic protective structure on a rigid substrate according to an embodiment of the present disclosure.

In the embodiment of the present disclosure, as shown in FIG. 4, FIG. 4 is a schematic diagram of formation of the organic protective structure and the inorganic protective structure on the rigid substrate according to an embodiment of the present disclosure. The single patterning process may be performed on the inorganic protective film on the rigid substrate 000 to form the organic protective structure 100 and the inorganic protective structure 200 on the rigid substrate 000.

For example, performing the single patterning process on the inorganic protective film to form the organic protective structure and the inorganic protective structure on the rigid substrate may include the following steps.

In step 3012*a*, a photoresist film is formed on the inorganic protective film.

In the embodiment of the present disclosure, the photoresist film may be formed on the rigid substrate on which the inorganic protective film is formed by any one of deposition, coating, sputtering and the like.

In step 3012*b*, the photoresist film is exposed and developed to form a photoresist pattern.

In the embodiment of the present disclosure, the photoresist film may be exposed first, and then the exposed photoresist film may be developed to acquire the photoresist pattern.

In step 3012*c*, first etching is performed on the inorganic protective film to form an inorganic protective structure with the photoresist pattern.

In the embodiment of the present disclosure, the first etching may be wet etching. In this way, a first etching solution may be adopted to perform the first etching on the inorganic protective film, to form the inorganic protective structure with the photoresist pattern.

In step 3012*d*, second etching is performed on the organic protective film to form an organic protective structure with the photoresist pattern and the inorganic protective structure.

In the embodiment of the present disclosure, the second etching may also be wet etching. In this way, a second etching solution may be adopted to perform the second etching on the organic protective film, to form the organic protective structure with the photoresist pattern and the inorganic protective structure.

In step 3012e, the photoresist pattern is removed to form the organic protective structure and the inorganic protective structure.

In the embodiment of the present disclosure, the photoresist pattern may be stripped off to form the organic protective structure 100 and the inorganic protective structure 200 shown in FIG. 4.

Figure 5:
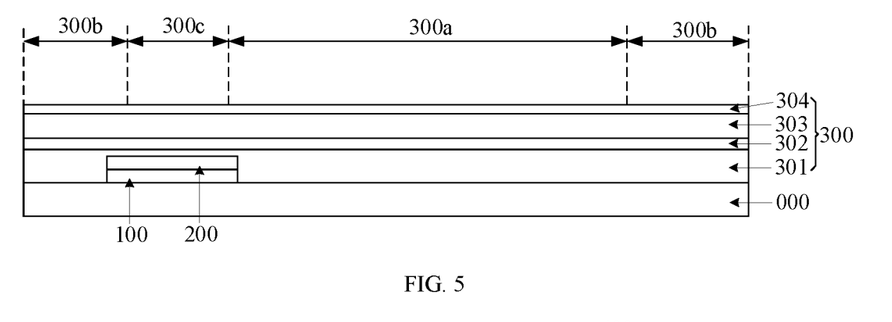
FIG. 5 is a schematic diagram of formation of a flexible substrate according to an embodiment of the present disclosure.

In step 302, a flexible substrate is formed on the inorganic protective structure.

In the embodiment of the present disclosure, the flexible substrate may be formed on the inorganic protective structure.

For example, as shown in FIG. 5, FIG. 5 is a schematic diagram of formation of the flexible substrate according to an embodiment of the present disclosure. A first polyimide (PI) layer 301, a first barrier layer 302, a second PI layer 303 and a second barrier layer 304 may be sequentially formed on the rigid substrate 000 on which the inorganic protective structure 200 is formed by any one deposition, coating, sputtering and the like.

The first PI layer 301, the first barrier layer 302, the second PI layer 303, and the second barrier layer 304 may form a flexible substrate 300 in the embodiment of the present disclosure.

The material of the first PI layer 301 and the material of the second PI layer 303 are organic materials, and are relatively soft, so that the flexibility of the flexible substrate 300 can be improved by the first PI layer 301 and the second PI layer 303. The first barrier layer 302 and the second barrier layer 304 can block external moisture and oxygen from entering the light-emitting devices formed on the flexible substrate 300, thereby prolonging the service life of the light-emitting devices formed on the flexible substrate 300.

In the embodiment of the present disclosure, as shown in FIG. 5, the flexible substrate 300 has a pixel region 300a, and the pixel island formed on the flexible substrate 300 subsequently may be disposed in the pixel region 300a. The flexible substrate 300 further has a connection region 300b, and the inter-island connector formed on the flexible substrate 300 subsequently may be disposed in the connection region 300b. The flexible substrate further has a hollow region 300c between the pixel region 300a and the connection region 300b, and the hollow structure defined by the pixel islands and the inter-island connectors may be disposed in the hollow region 300c.

The orthographic projections of the organic protective structure 100 and the inorganic protective structure 200 formed in the above step 301 on the rigid substrate 000 cover the orthographic projection of the hollow region 300c in the flexible substrate 300 on the rigid substrate 000.

Figure 6:
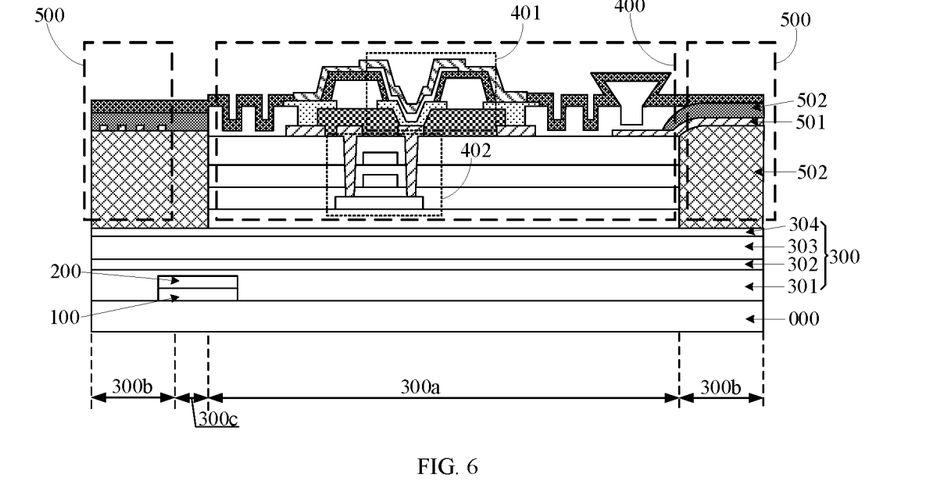
FIG. 6 is a schematic diagram of formation of a plurality of functional layers on a flexible substrate according to an embodiment of the present disclosure.

In step 303, a plurality of pixel islands and inter-island connectors for connecting adjacent pixel islands are formed on the flexible substrate.

In the embodiment of the present disclosure, the pixel island may include a plurality of light-emitting devices, and a plurality of drive circuits connected in one-to-one correspondence to the plurality of light-emitting devices. The light-emitting device may be an organic light-emitting diode (OLED) device. The inter-island connector may include a connection trace, and a trace protective structure for protecting the connection trace. The trace protective structure can reduce the probability of breakage of the connection trace in the stretching process of the stretchable display panel prepared later.

For example, forming the plurality of pixel islands and inter-island connectors for connecting adjacent pixel islands on the flexible substrate may include the following steps.

In step 3031, a plurality of functional layers are formed on the flexible substrate.

In the embodiment of the present disclosure, please refer to FIG. 6, which is a schematic diagram of formation of the plurality of functional layers on the flexible substrate according to an embodiment of the present disclosure. Forming the plurality of functional layers on the flexible substrate may include the following steps.

In step 3031a, a plurality of display functional layers are formed in the pixel region in the flexible substrate.

In the embodiment of the present disclosure, a plurality of display functional layers may be formed in the pixel region 300a of the flexible substrate 300. The plurality of display functional layers are configured to form a light-emitting device 401 in a pixel island 400 and a drive circuit 402 connected to the light-emitting device 401.

In step 3031b, a plurality of connection functional layers are formed in a region, other than the pixel region, of the flexible substrate.

In the embodiment of the present disclosure, the plurality of connection functional layers are configured to form the connection traces 501 and the trace protective structures 502 in the inter-island connector 500.

For example, the method for manufacturing the plurality of display functional layers involved in the above step 3031a, and the method for manufacturing the plurality of connection functional layers involved in the above step 3031b may include the following sub-steps.

Figure 7:
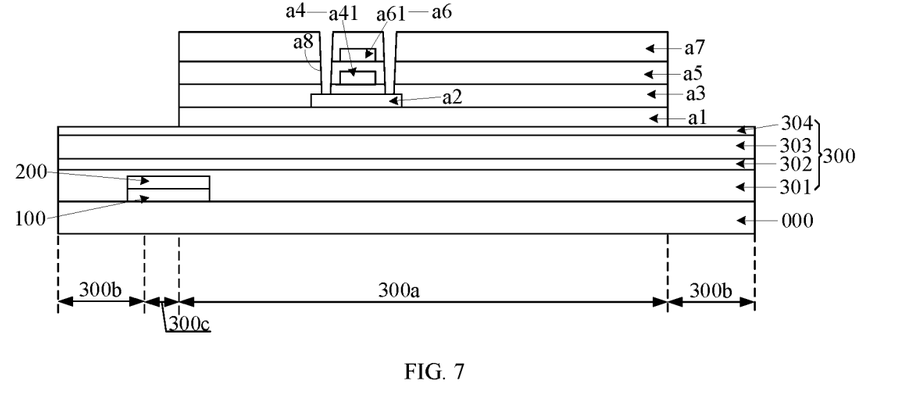
FIG. 7 is a schematic diagram of sequential formation of a buffer layer, an active layer, a first gate insulating layer, a first conductive pattern, a second gate insulating layer, a second conductive pattern and an interlayer dielectric layer in a pixel region in a flexible substrate according to an embodiment of the present disclosure.

In sub-step a, a buffer layer, an active layer, a first gate insulating layer, a first conductive pattern, a second gate insulating layer, a second conductive pattern and an interlayer dielectric layer are sequentially formed in the pixel region in the flexible substrate.

For example, as shown in FIG. 7, FIG. 7 is a schematic diagram of sequential formation of the buffer layer, the active layer, the first gate insulating layer, the first conductive pattern, the second gate insulating layer, the second conductive pattern and the interlayer dielectric layer in the pixel region of the flexible substrate according to an embodiment of the present disclosure.

The material of the buffer layer a1 may include silicon dioxide, silicon nitride or a mixed material of silicon dioxide and silicon nitride. The buffer layer a1 is configured to block ions in the flexible substrate 300 from entering the active layer a2, thereby preventing performance of the active layer a2 from being affected by the ions.

The material of the active layer a2 may include polysilicon.

The materials of the first gate insulating layer a3, the second gate insulating layer a5 and the interlayer dielectric layer a7 may all include silicon dioxide, silicon nitride or a mixed material of silicon dioxide and silicon nitride.

Materials of the first conductive pattern a4 and the second conductive pattern a6 may include a metal material such as metal molybdenum, metal copper, metal aluminum or an alloy. The first conductive pattern a4 may include a gate a41 and a gate line connected to the gate a41; and the second conductive pattern a6 may include an auxiliary electrode a61. The auxiliary electrode a61 and the gate a41 can form a storage capacitor in a subsequently formed drive circuit.

The above process of sequentially forming the buffer layer a1, the active layer a2, the first gate insulating layer a3, the first conductive pattern a4, the second gate insulating layer a5, the second conductive pattern a6 and the interlayer dielectric layer a7 in the pixel region 300a of the flexible substrate 300 is as follows.

Firstly, a buffer material layer may be formed on the flexible substrate 300 by any one of deposition, coating, sputtering and the like.

Next, an active material layer may be formed on the buffer material layer by any one of deposition, coating, sputtering and the like, and a single patterning process is performed on the active material layer to form the active layer a2 on the buffer material layer.

Afterwards, a first gate insulating material layer may be formed on the active layer a2 by any one of deposition, coating, sputtering and the like.

Afterwards, a first conductive material layer may be formed on the first gate insulating material layer by any one of deposition, coating, sputtering and the like, and the single patterning process is performed on the first conductive material layer to form the first conductive pattern a4 on the first gate insulating material layer.

Afterwards, a second gate insulating material layer may be formed on the first conductive pattern a4 by any one of deposition, coating, sputtering and the like.

Afterwards, a second conductive material layer may be formed on the second gate insulating material layer by any one of deposition, coating, sputtering and the like, and the single patterning process is performed on the second conductive material layer to form the second conductive pattern a6 on the second gate insulating material layer.

Afterwards, an interlayer dielectric material layer may be formed on the second conductive pattern a6 by any one of deposition, coating, sputtering and the like.

Finally, the single patterning process may be performed on the interlayer dielectric material layer to sequentially form the buffer layer a1, the first gate insulating layer a3, the second gate insulating layer a5, and the interlayer dielectric layer a7 in the pixel region 300a of the flexible substrate 300, and form a source/drain via a8. The source/drain via a8 penetrates through the interlayer dielectric layer a7, the second gate insulating layer a5 and the first gate insulating layer a3.

It should be noted that, the single patterning process in the above embodiment may include: photoresist coating, exposure, development, etching, and photoresist stripping.

Figure 8:
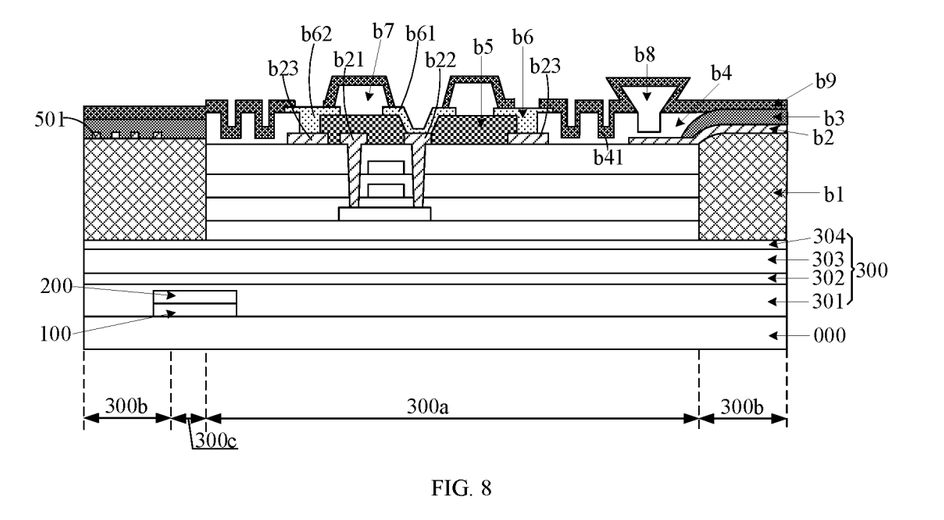
FIG. 8 is a schematic diagram of sequential formation of a first planarization layer, a third conductive pattern, a second planarization layer, a dielectric layer, a third planarization layer, a fourth conductive pattern, a pixel definition layer, a barrier column and a protective layer on a rigid substrate on which the interlayer dielectric layer is formed according to an embodiment of the present disclosure.

In sub-step b, a first planarization layer, a third conductive pattern, a second planarization layer, a dielectric layer, a third planarization layer, a fourth conductive pattern, a pixel definition layer, a barrier column, and a protective layer are sequentially formed on the rigid substrate on which the interlayer dielectric layer is formed.

For example, as shown in FIG. 8, FIG. 8 is a schematic diagram of sequential formation of the first planarization layer, the third conductive pattern, the second planarization layer, the dielectric layer, the third planarization layer, the fourth conductive pattern, the pixel definition layer, the barrier column, and the protective layer on the rigid substrate on which the interlayer dielectric layer is formed according to an embodiment of the present disclosure.

The material of each of the first planarization layer b1, the second planarization layer b3, the third planarization layer b5, the pixel definition layer b7 and the barrier column b8 may include an organic material, and for example, may be at least one selected from polymethyl methacrylate and polystyrene-based polymers, phenolic group-based polymers and derivatives thereof, acrylic-based polymers, paraxylene-based polymers, aryl ether-based polymers, amide-based polymers, fluoride-based polymers, and vinyl alcohol-based polymers.

The material of the third conductive pattern b2 may include a metal material such as metal molybdenum, metal copper, metal aluminum or an alloy.

The materials of the dielectric layer b4 and the protective layer b9 may both include an inorganic insulating material such as silicon nitride, silicon oxynitride or silicon oxide. The dielectric layer b4 may be in the pixel region 300a of the flexible substrate 300, the protective layer b9 is in the pixel region 300a and the connection region 300b of the flexible substrate 300, and the protective layer b9 in the connection region 300b also belongs to the trace protective structure 502 in the inter-island connector 500.

The material of the fourth conductive pattern b6 may include a transparent conductive material such as indium tin oxide (ITO) or indium zinc oxide (IZO).

In the embodiment of the present disclosure, the first planarization layer b1 and the second planarization layer b3 in the above embodiment are in the connection region 300b of the flexible substrate 300, and the first planarization layer b1 and the second planarization layer b3 are the trace protective structure 502 in the inter-island connector 500.

For the third conductive pattern b2 and the fourth conductive pattern b6 in the above embodiment, the third conductive pattern b2 may include a source b21, a drain b22, a signal control line b23 and the connection trace 501, and the fourth conductive pattern b6 may include an anode b61 and a connection electrode b62. The source b21 and the drain b22 may be electrically connected to the active layer a2 through the source/drain via a8. The source b21, the drain b22, the signal control line b23, the anode b61 and the connection electrode b62 may all be in the pixel region 300a of the flexible substrate 300, and the connection trace 501 may be in the connection region 300b of the flexible substrate 300. The connection electrode b62 may be electrically connected to the signal control line b23. One of the source b21 and the drain b22 may be electrically connected to the anode b61, and the third conductive pattern b2 may further include: a data line connected to the other one of the source b21 and the drain b22. Anode voltage can be applied to the anode b61 through the data line.

For the dielectric layer b4 in the above embodiment, a plurality of grooves b41 are formed in the dielectric layer N. After the encapsulation layer is subsequently formed, a plurality of protrusions in one-to-one correspondence to the plurality of grooves b41 may be formed on a side of the encapsulation layer close to the dielectric layer b4, such that the contact interface between the dielectric layer b and the encapsulation layer can be effectively increased, thereby reducing edge encapsulation effect of the encapsulation layer. Meanwhile, the moisture and oxygen erosion path is also increased, which improves the encapsulation effect.

The third planarization layer b5 in the above embodiment plays a role of ensuring the uniformity of light emitted from the formed light-emitting device 401.

The barrier column b8 in the above embodiment is of an inverted trapezoidal structure. The barrier column b8 can effectively reduce the probability that cracks generated in the connection region 300b in the stretching process of the prepared stretchable display substrate enter the pixel region 300a.

For the protective layer b9 in the above embodiment, the protective layer b9 may cover the barrier columns b8. The protective layer b9 can protect film layer structures under the protective layer b9 when the hollow structures are formed by etching.

The process of sequentially forming the first planarization layer b1, the third conductive pattern b2, the second planarization layer b3, the dielectric layer b, the third planarization layer b5, the fourth conductive pattern b6, the pixel definition layer b7, the barrier columns b8 and the protective layer b9 on the rigid substrate 100 on which the interlayer dielectric layer 17 is formed is as follows.

Firstly, the first planarization layer b1 may be formed in a region, other than the pixel region 300a, of the flexible substrate 300.

Next, a third conductive material layer may be formed on the flexible substrate 300 on which the first planarization layer b1 is formed by any one of deposition, coating sputtering and the like, and the single patterning process is performed on the third conductive material layer to form the third conductive pattern b2.

Afterwards, the second planarization layer b3 may be formed in the region, other than the pixel region 300a, of the flexible substrate 300.

Afterwards, a layer of inorganic insulating film may be formed on the rigid substrate 100 on which the second planarization layer is formed by any one of deposition, coating sputtering and the like, and the single patterning process is performed on inorganic insulating film to form the dielectric layer b4.

Afterwards, the third planarization layer b5 may be formed on the dielectric layer b4.

Afterwards, a fourth conductive material layer may be formed on the rigid substrate 100 on which the third planarization layer b5 is formed by any one of deposition, coating sputtering and the like, and the single patterning process is performed on the fourth conductive material layer to form the fourth conductive pattern b6.

Finally, the pixel definition layer b7, the barrier column b8 and the protective layer b9 may be sequentially formed on the fourth conductive pattern b6.

It should be noted that, vias need to be formed in portions, in contact with the anode b61 and the connection electrode b62, of the protective layer b9, to facilitate the electrical connection between the anode b61 and the connection electrode b62 and other film layer structures.

It should further be noted that the single patterning process in the above embodiment may include: photoresist coating, exposure, development, etching, and photoresist stripping.

Figure 9:
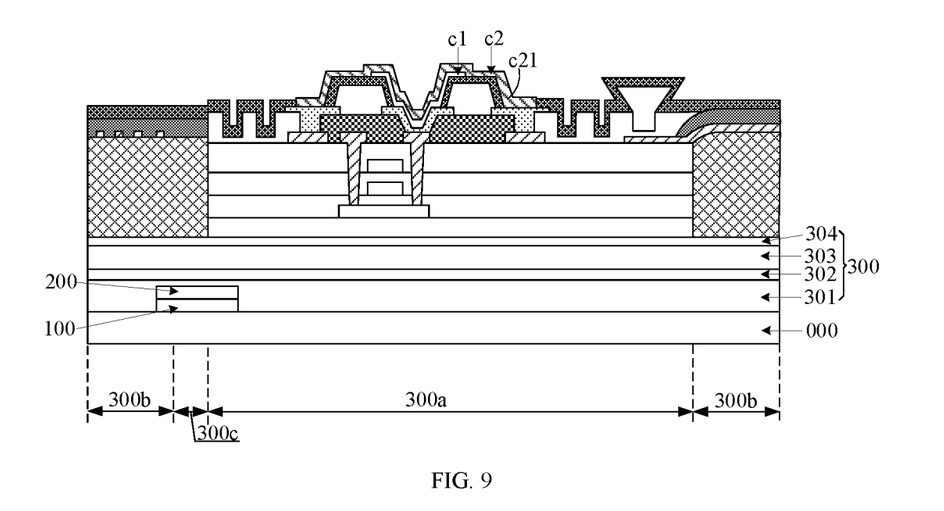
FIG. 9 is a schematic diagram of sequential formation of a light-emitting layer and a fifth conductive pattern on the rigid substrate on which the protective layer is formed according to an embodiment of the present disclosure.

In sub-step c, a light-emitting layer and a fifth conductive pattern are sequentially formed on the rigid substrate on which the protective layer is formed.

For example, as shown in FIG. 9, FIG. 9 is a schematic diagram of sequential formation of the light-emitting layer and the fifth conductive pattern on the rigid substrate on which the protective layer is formed according to an embodiment of the present disclosure.

The material of the light-emitting layer c1 may include a phosphorescent light-emitting material or a fluorescent light-emitting material. The material of the fifth conductive pattern c2 may include a metal material such as metal molybdenum, metal copper, metal aluminum or an alloy.

The fifth conductive pattern c2 may include: a cathode c21. The light-emitting layer c1 is connected to the cathode c21 and the anode b61. In addition, the cathode c21 further needs to be electrically connected to the connection electrode b62. In the embodiment of the present disclosure, the cathode c21 may be connected to the signal control line b23 through the connection electrode b62, so that cathode voltage can be applied to the cathode c21 through the signal control line b23.

The above process of sequentially forming the light-emitting layer and the fifth conductive pattern on the rigid substrate 100 on which the protective layer b9 is formed is as follows.

Firstly, the light-emitting layer c1 may be formed on the protective layer b9 by an inkjet printing process or an evaporation process; afterwards, a fifth conductive material layer may be formed on the rigid substrate 100 on which the light-emitting layer c1 is formed by any one of deposition, coating, sputtering and the like; and finally the single patterning process is performed on the fifth conductive material layer to form the fifth conductive pattern c2. The single patterning process may include: photoresist coating, exposure, development, etching and photoresist stripping.

In the embodiment of the present disclosure, through the above sub-steps a to c, the plurality of display functional layers can be formed in the pixel region 300a of the flexible substrate 300, and the plurality of connection functional layers can be formed in the region, other than the pixel region 300a, of the flexible substrate 300.

In the above embodiment, the anode b61, the light-emitting layer c1, the cathode c21 and the like form the light-emitting device 401 in the embodiment of the present disclosure. The gate a41, the auxiliary electrode a61, the active layer a2, the source b21, the drain b22 and the like form the drive circuit 402 in the embodiment of the present disclosure.

Figure 10:
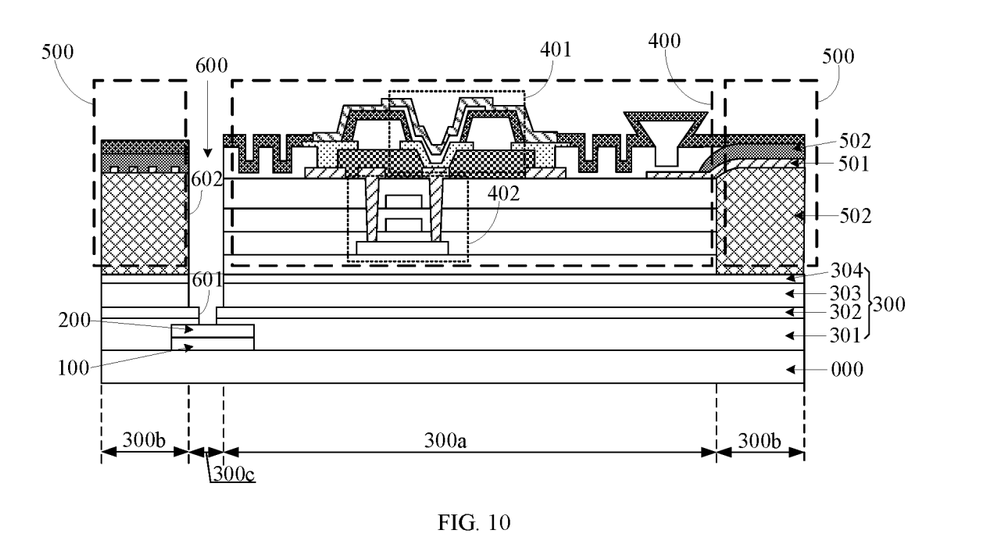
FIG. 10 is a schematic diagram of formation of openings in a plurality of functional layers on a flexible substrate to form pixel islands and inter-island connectors according to an embodiment of the present disclosure.

In step 3032, openings are formed in the plurality of functional layers on the flexible substrate to form the pixel islands and the inter-island connectors.

For example, as shown in FIG. 10, FIG. 10 is a schematic diagram of formation of openings in the plurality of functional layers on the flexible substrate to form the pixel islands and inter-island connectors according to an embodiment of the present disclosure. The formation of openings in the plurality of functional layers on the flexible substrate to form the islands and inter-island connectors may include: removing portions, other than the connection region 300a, of the plurality of connection functional layers, and removing portions, other than the connection region 300b and the pixel region 300a, of the flexible substrate 300, to form the pixel islands 400 and the inter-island connectors 500. In this case, the pixel islands 400 and the inter-island connectors 500 may define hollow structures 600.

In the embodiment of the present disclosure, the materials of the flexible substrate 300 and the organic protective structure 100 formed on the rigid substrate 000 are both organic materials. In the process of forming openings in the plurality of functional layers to etch away portion of the flexible substrate 300, the organic protective structure 100 can be protected by the inorganic protective structure 200 on the organic protective structure 100, so as to prevent the organic protective structure 100 from being etched.

Optionally, the hollow structure 600 may include a first opening 601, and a second opening 602 communicated with the first opening 601. The first opening 601 is closer to the rigid substrate 000 than the second opening 602 is. An orthographic projection of the first opening 601 on the rigid substrate 100 is within an orthographic projection of the second opening 602 on the rigid substrate 100, that is, the size of the first opening 601 is less than that of the second opening 602. For example, when shapes of the first opening 601 and the second opening 602 are both circular, the diameter of the first opening 601 is less than the diameter of the second opening 602. The diameter of the first opening 601 may be 15 microns, and the diameter of the second opening 602 may be 90 microns. In this way, in the process of stretching the formed stretchable display panel, if cracks occur in the encapsulation layer, the cracks do not extend further after extending to the first opening 601 with a smaller size, thereby effectively improving the encapsulation effect of the formed encapsulation layer.

In some embodiments, the first opening 601 is sleeved in the second opening 602. In some embodiments, when the shapes of the first opening 601 and the second opening 602 are both circular, the central axis of the first opening 601 coincides with the central axis of the second opening 602.

In some embodiments, the diameter of the first opening 601 may range from 10 microns to 20 microns, and the diameter of the second opening 602 may range from 85 microns to 95 microns.

In some embodiments, the ratio of the diameter of the second opening 602 to the diameter of the first opening 601 may be 6:1. In some embodiments, the ratio of the diameter of the second opening 602 to the diameter of the first opening 601 is in the range of 5:1 to 7:1. In some embodiments, the ratio of the diameter of the second opening 602 to the diameter of the first opening 601 is in the range of 4:1 to 8:1. In some embodiments, the ratio of the diameter of the second opening 602 to the diameter of the first opening 601 is in the range of 5:1 to 10:1.

In some embodiments, a slope angle of a sidewall of the first opening 601 is greater than a slope angle of a sidewall of the second opening 602.

For example, the slope angle of the sidewall of the first opening 601 may be 90 degrees, and the slope angle of the sidewall of the second opening 602 may be 30 degrees. In the case that the slope angle of the sidewall of the first opening 601 is 90 degrees, the first opening 601 may further reduce the probability that the cracks, at the position of the first opening 601, in the encapsulation layer are transmitted, thereby further improving the encapsulation effect of the encapsulation layer formed.

It should be noted that, in the process of forming the pixel islands and inter-island connectors on the flexible substrate, the above sub-step a, sub-step b and step 3032 may also be executed in sequence at first, and then the above sub-step c is executed. The sequence of steps in the manufacturing process is not limited in the embodiments of the present disclosure.

Figure 11:
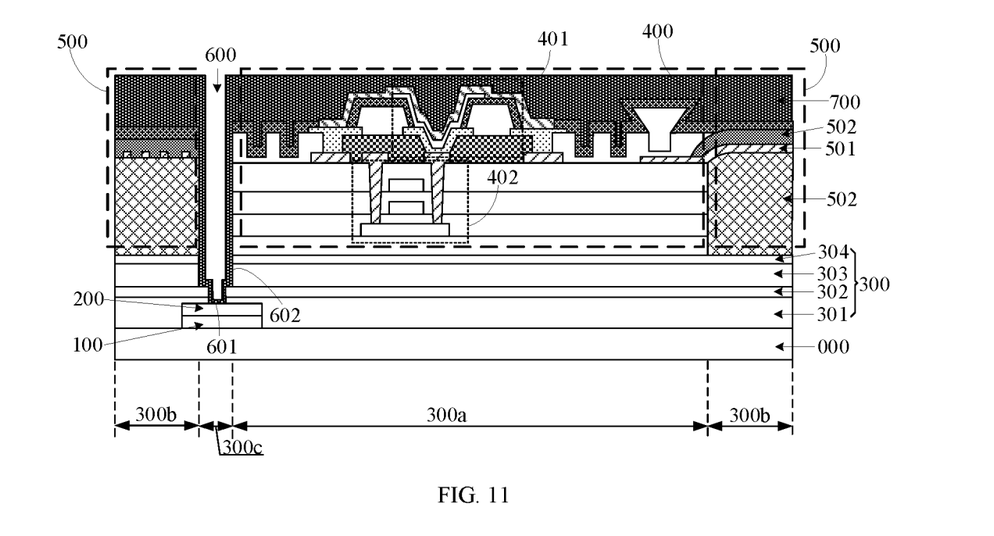
FIG. 11 is a schematic diagram of formation of an encapsulation layer on pixel islands and inter-island connectors according to an embodiment of the present disclosure.

In step 304, an encapsulation layer is formed on the pixel islands and the inter-island connectors.

In the embodiment of the present disclosure, the encapsulation layer may be formed on the pixel islands and the inter-island connectors. Optionally, the encapsulation layer may be formed of a plurality of layers of inorganic layers and organic layers which are alternately disposed.

For example, as shown in FIG. 11, FIG. 11 is a schematic diagram of formation of the encapsulation layer on the pixel islands and inter-island connectors according to an embodiment of the present disclosure. The encapsulation layer 700 may be formed on the pixel islands 400 and the inter-island connectors 500 by any one of deposition, coating, sputtering and the like. The encapsulation layer 700 is in contact with the inorganic protective structure 200 in the hollow region 300c of the flexible substrate 300.

Figure 12:
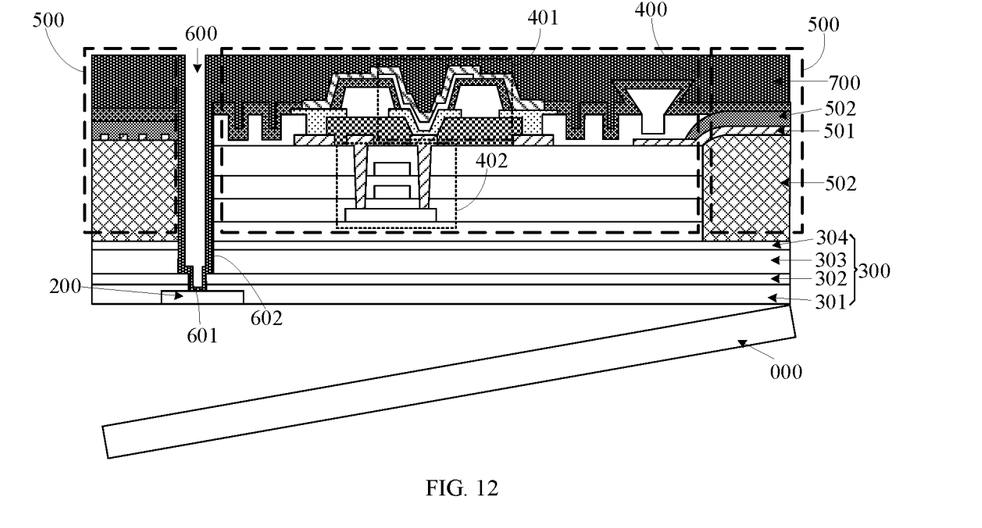
FIG. 12 is a schematic diagram of stripping off a rigid substrate according to an embodiment of the present disclosure.

In step 305, the rigid substrate is stripped off after the organic protective structure and the flexible substrate are carbonized.

In the embodiment of the present disclosure, after the organic protective structure and the flexible substrate are carbonized, the rigid substrate may be stripped off. For example, as shown in FIG. 12, FIG. 12 is a schematic diagram of stripping off the rigid substrate according to an embodiment of the present disclosure. The organic protective structure 100 and the flexible substrate 300 may be carbonized by laser exposure, so that the carbonized organic protective structure 100 and the carbonized flexible substrate 300 lose the adhesion to the rigid substrate 100. In this way, the rigid substrate 100 may be stripped off to acquire a stretchable display panel.

It should be noted that, since the method of stripping off the rigid substrate 100 belongs to a mechanical stripping method, in the process of stripping off the rigid substrate 100, the inorganic protective structure 200 may also be stripped off. After the rigid substrate 100 is stripped off, whether the inorganic protective structure 200 exists in the hollow region 300c of the flexible substrate 300 does not affect the stretching process of the acquired stretchable display panel. In some embodiments, after the rigid substrate 100 is stripped off, the inorganic protective structure 200 exists in the hollow region 300c of the flexible substrate 300, that is, when the rigid substrate is stripped off, the organic protective structure 100 is separately stripped off. In some embodiments, after the rigid substrate 100 is stripped off, no inorganic protective structure 200 or organic protective structure 100 exists in the hollow region 300c of the flexible substrate 300, that is, when the rigid substrate is stripped off, the inorganic protective structure 200 and the organic protective structure 100 are also stripped off.

Figure 13:
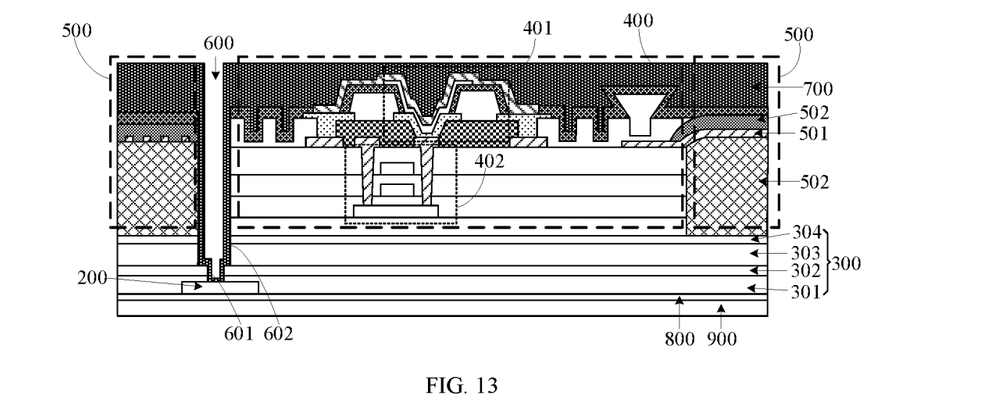
FIG. 13 is a schematic diagram of formation of a protective film on a side, away from the encapsulation layer, of the flexible substrate according to an embodiment of the present disclosure.

In step 306, a protective film is formed on a side, away from the encapsulation layer, of the flexible substrate.

In the embodiment of the present disclosure, the protective film may be formed on the side, away from the encapsulation layer, of the flexible substrate. For example, as shown in FIG. 13, FIG. 13 is a schematic diagram of formation of the protective film on the side, away from the encapsulation layer, of the flexible substrate according to an embodiment of the present disclosure. The protective film 900 may be adhered to the side, away from the encapsulation layer 700, of the flexible substrate 300 through an adhesive layer 800. The adhesive layer 800 may adopt optical clear adhesive (OCA), and the material may be selected from acrylic or silicon-based adhesive materials.

In the present disclosure, by disposing the protective film 900 on the side, away from the encapsulation layer 700, of the flexible substrate 300, internal components in the stretchable display panel can be better protected. The material of the protective film 900 may be an elastic material, and the elastic material may be any one of dimethylsiloxane and polyimide. In this way, by adopting the protective film 900 made of an elastic material, the internal components of the stretchable display substrate can be protected without affecting the stretching of the stretchable display substrate.

It should be noted that the schematic diagram shown in FIG. 13 above is a schematic diagram of the film layer structure of the stretchable display panel prepared by the method for manufacturing a stretchable display panel in the embodiment of the present disclosure.

In summary, in the method for manufacturing a stretchable display panel according to the embodiment of the present disclosure, the organic protective structure and the inorganic protective structure are firstly formed on the rigid substrate, and the orthographic projection of the organic protective structure on the rigid substrate and the orthographic projection of the inorganic protective structure on the rigid substrate cover the orthographic projection of the hollow structure on the rigid substrate. In this way, after the encapsulation layer is formed, the encapsulation layer is not in contact with the rigid substrate, but the organic protective structure is always in contact with the rigid substrate. It's extremely easy to strip off the organic protective structure from the rigid substrate, and the probability of cracks occurring in the stripping process is relatively low, so that the probability of encapsulation failure of the encapsulation layer is effectively reduced, thereby prolonging the service life of the light-emitting devices in the pixel islands.

Figure 14:
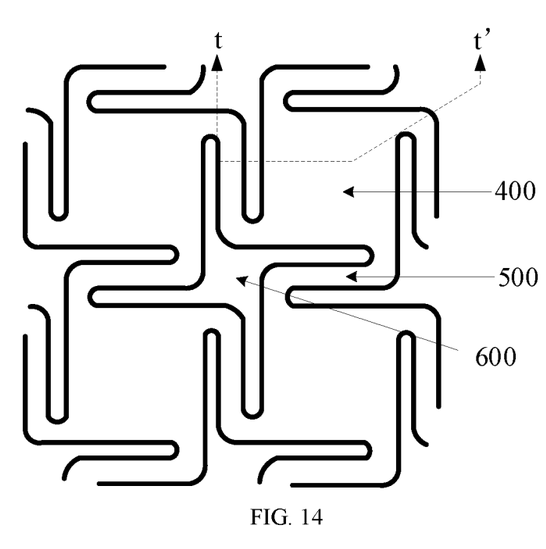
FIG. 14 is a top view of a stretchable display panel according to an embodiment of the present disclosure.

An embodiment of the present disclosure further provides a stretchable display panel, and the stretchable display panel may be manufactured by the method for manufacturing a stretchable display panel shown in FIG. 2 or FIG. 3. In the embodiment of the present disclosure, as shown in FIG. 14, FIG. 14 is a top view of a stretchable display panel according to the embodiment of the present disclosure. For the sectional view at t-t' in FIG. 14, reference may be made to the schematic diagram of film layers shown in FIG. 13. The stretchable display panel may include: a flexible substrate 300 (not shown in FIG. 14), and a plurality of pixel islands 400 and inter-island connectors 500 for connecting adjacent pixel islands 400, which are disposed on the flexible substrate 300. The pixel islands 400 and the inter-island connectors 500 may define hollow structures 600.

The stretchable display panel may further include: an encapsulation layer 700 (not shown in FIG. 14), and the encapsulation layer 700 is disposed on the pixel islands 400 and the inter-island connectors 500.

Optionally, the hollow structure 600 may include: a first opening 601, and a second opening 602 communicated with the first opening 601. The first opening 601 is closer to the flexible substrate 300 than the second opening 602 is, and an orthographic projection of the first opening 601 on the flexible substrate 300 is within an orthographic projection of the second opening 602 on the flexible substrate 300.

Optionally, a slope angle of a sidewall of the first opening 601 is 90 degrees.

Optionally, the stretchable display panel may further include: a protective film 900 disposed on the side, away from the encapsulation layer 700, of the flexible substrate 300. The protective film 900 may be adhered to the flexible substrate 300 through an adhesive layer 800.

Those skilled in the art can clearly understand that, for the convenience and simplicity of descriptions, for the principles of components in the stretchable display panel described above, reference may be made to the corresponding content in the embodiments of the above method for manufacturing a stretchable display panel, details are not repeated here.

An embodiment of the present disclosure further provides a display device, and the display device may include the stretchable display panel shown in FIG. 14. The display device may be any product or component with a display function, such as electronic paper, a mobile phone, a tablet computer, a television, a display, a notebook computer, a digital photo frame and a navigator.

It should be noted that in the accompanying drawings, for clarity of the illustration, the dimension of the layers and regions may be scaled up. It may be understood that when an element or layer is described as being "on" another element or layer, the described element or layer may be directly on the other element or layer, or there is an intermediate layer. In addition, it may be understood that when an element or layer is described as being "under" another element or layer, the described element or layer may be directly below the other element or layer, or there are more than one intermediate layers. In addition, it may be further understood that when a layer or element is described as being "between" two layers or elements, the described layer or element may be the only layer between the two layers or elements, or there are more than one intermediate layers or elements. In the whole descriptions, like reference numerals denote like elements.

In the present disclosure, the terms "first" and "second" are merely used for descriptions, but not denote or imply any relative importance. The term "a plurality of" means two or more, unless specifically defined otherwise.

The descriptions above are merely exemplary embodiments of the present disclosure, and are not intended to limit the present disclosure. Within the spirit and principles of the disclosure, any modifications, equivalent substitutions, improvements, and the like are within the protection scope of the present disclosure.

What is claimed is:

1. A method for manufacturing a stretchable display panel, comprising:
   forming an organic protective structure and an inorganic protective structure which are laminated on a rigid substrate;
   forming a flexible substrate on the inorganic protective structure;
   forming a plurality of pixel islands and inter-island connectors for connecting adjacent pixel islands on the flexible substrate, wherein the plurality of pixel islands and the inter-island connectors define hollow structures, and an orthographic projection of the hollow structure on the rigid substrate is within an orthographic projection of the organic protective structure on the rigid substrate and within an orthographic projection of the inorganic protective structure on the rigid substrate;
   forming an encapsulation layer on the plurality of pixel islands and the inter-island connectors; and
   stripping off the rigid substrate; and
   wherein the hollow structure extends to the inorganic protective structure and is not in contact with the organic protective structure.

2. The method according to claim 1, wherein the hollow structure comprises:
   a first opening, and a second opening communicated with the first opening, wherein the first opening is closer to the rigid substrate than the second opening is, and an orthographic projection of the first opening on the rigid substrate is within an orthographic projection of the second opening on the rigid substrate.

3. The method according to claim 2, wherein the first opening is sleeved in the second opening.

4. The method according to claim 2, wherein a slope angle of a sidewall of the first opening is greater than a slope angle of a sidewall of the second opening.

5. The method according to claim 1, wherein forming the organic protective structure and the inorganic protective structure which are laminated on the rigid substrate comprises:
   forming an organic protective film and an inorganic protective film in sequence on the rigid substrate; and
   performing a single patterning process on the inorganic protective film to form the organic protective structure and the inorganic protective structure on the rigid substrate.

6. The method according to claim 5, wherein performing the single patterning process on the inorganic protective film to form the organic protective structure and the inorganic protective structure on the rigid substrate comprises:

forming a photoresist film on the inorganic protective film;

performing exposure and development on the photoresist film to form a photoresist pattern;

performing first etching on the inorganic protective film to form the inorganic protective structure with the photoresist pattern;

performing second etching on the organic protective film to form the organic protective structure with the photoresist pattern and the inorganic protective structure; and removing the photoresist pattern to form the organic protective structure and the inorganic protective structure.

7. The method according to claim 1, wherein stripping off the rigid substrate comprises:

stripping off the rigid substrate after carbonizing the organic protective structure and the flexible substrate.

8. The method according to claim 7, wherein when the rigid substrate is stripped off, the organic protective structure, or the organic protective structure and the inorganic protective structure are also stripped off.

9. The method according to claim 1, wherein forming the plurality of pixel islands and the inter-island connectors for connecting adjacent pixel islands on the flexible substrate comprises:

forming a plurality of functional layers on the flexible substrate; and forming openings in the plurality of functional layers to form the plurality of pixel islands and the inter-island connectors, wherein the hollow structures penetrate the plurality of functional layers and the flexible substrate.

10. The method according to claim 9, wherein the flexible substrate comprises a pixel region, and the pixel island is disposed in the pixel region; and forming the plurality of functional layers on the flexible substrate comprises:

forming a plurality of display functional layers in the pixel region of the flexible substrate, the plurality of display functional layers being configured to form light-emitting devices in the plurality of pixel islands and drive circuits connected to the light-emitting devices; and forming a plurality of connection functional layers in a region, other than the pixel region, of the flexible substrate, the plurality of connection functional layers being configured to form connection traces and trace protective structures in the inter-island connectors.

11. The method according to claim 10, wherein the flexible substrate further comprises a connection region, and an inter-island connector is disposed in the connection region; and forming the openings in the plurality of functional layers to form the plurality of pixel islands and the inter-island connectors comprises:

removing portions, other than the connection region, of the plurality of connection functional layers, and removing portions, other than the connection region and the pixel region, of the flexible substrate, to form the plurality of pixel islands and the island interconnectors.

12. The method according to claim 1, wherein after stripping off the rigid substrate, the method further comprises:

forming a protective film on a side, away from the encapsulation layer, of the flexible substrate.

13. The method according to claim 1, wherein the inorganic protective structure is made of a metal material.

* * * * *